STABILIZED BEAT FREQUENCY OSCILLATOR FOR MULTI-FREQUENCY RECEIVER

Filed July 20, 1962 4 Sheets-Sheet 1

INVENTOR

Niels Georg Kruse

BY Stevens, Davis, Miller + Mosher

ATTORNEYS

STABILIZED BEAT FREQUENCY OSCILLATOR FOR MULTI-FREQUENCY RECEIVER

Filed July 20, 1962 4 Sheets-Sheet 2

INVENTOR

Niels Georg Kruse

BY Stevens, Davis, Miller + Mosher

ATTORNEYS

April 26, 1966 N. G. KRUSE 3,248,652

STABILIZED BEAT FREQUENCY OSCILLATOR FOR MULTI-FREQUENCY RECEIVER

Filed July 20, 1962

4 Sheets-Sheet 3

INVENTOR

Nicls Georg Kruse

BY Stevens, Davis, Miller + Mosher

ATTORNEYS

INVENTOR
Niels Georg Kruse
BY Stevens, Davis, Miller + Mosher
ATTORNEY

United States Patent Office 3,248,652
Patented Apr. 26, 1966

3,248,652
STABILIZED BEAT FREQUENCY OSCILLATOR FOR MULTI-FREQUENCY RECEIVER

Niels Georg Kruse, 2 Ved Stationen, Kastrup, Denmark
Filed July 20, 1962, Ser. No. 211,316
3 Claims. (Cl. 325—430)

Figure 1:
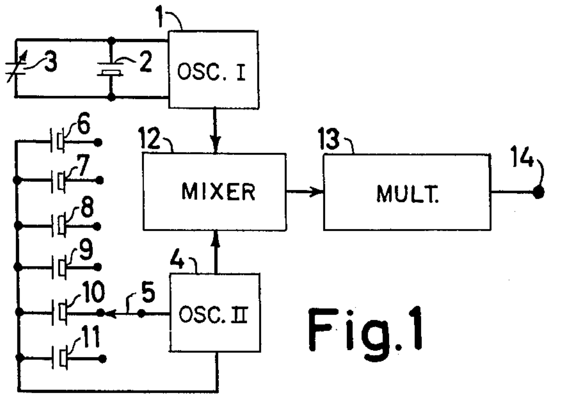

This invention relates to an oscillator circuit arrangement, particularly for transmitters and receivers for communication systems and navigation systems, said circuit arrangement comprising two crystal-controlled oscillators, the output signals of which are supplied to a mixing stage producing a signal, which after frequency conversion in a frequency multiplier constitutes the output signal of the circuit arrangement.

In prior art circuit arrangements of this kind, the frequency of the output signal of the mixing stage is equal to the sum of the frequencies of the two oscillations, generated by the two crystal-controlled oscillators.

Moreover it is known, that it is possible to vary the frequency of a crystal-controlled oscillator a little by changing a capacity parallel- or series-connected with the frequency-determining crystal. The obtainable frequency variation is, however, rather small, for example one per thousand, and it has, therefore, heretofore only been used for the adjustment of the frequency of the oscillator in question.

In crystal-controlled oscillator circuit arrangements for the production of a plurality of separate frequencies it has, therefore, heretofore been necessary to use a plurality of crystals, and it has not heretofore been possible to construct crystal-controlled oscillators, the frequency of which could be varied continuously over a considerable frequency range.

The invention has for its object to remedy these drawbacks. To this end, the oscillator circuit arrangement according to the invention is characterized in that the frequencies of the oscillations generated by the two oscillators are close to each other, and that at least one oscillator comprises at least one capacitor, capable of being connected to the frequency-controlling crystal of the oscillator for varying the oscillator frequency, the mixing stage being arranged to separate, as input signal for the frequency multiplier, the difference frequency between the two oscillator frequencies. Due to the use of the difference frequency it is possible by means of a single pair of crystals to cover a substantially greater frequency range than in the heretofore known crystal-controlled oscillator circuit arrangements. If by way of example it be assumed, that in the two oscillators crystals are used, the frequencies of which can be varied one per thousand by means of capacitors connected thereto, and that the frequencies of the two crystals lie so close to each other that the difference frequency constitutes about 1/10 of the natural frequencies of the crystals, the frequency variation attainable in the difference frequency will amount to about one percent, and this fact is not altered by the subsequent frequency multiplication. Consequently, it is possible by means of a single pair of crystals to cover a frequency range, which is about ten times the range, which heretofore it has been possible to cover by means of a single pair of crystals.

According to the invention the said capacitor or one or more of the said capacitors may be continuously variable. Hereby it is possible to obtain a crystal-controlled oscillator circuit arrangement, having a variable output frequency. Such circuit arrangement can for example be used in a measuring transmitter.

Another embodiment of the oscillator circuit arrangement according to the invention, is characterized in that at least one oscillator comprises two or more fixedly adjustable capacitors, which by means of a switch can according to wish be connected to the crystal or crystals of the oscillator. Hereby it is possible by means of a single pair of crystals to cover a great number of separate frequencies, which afford a considerable economy with respect to crystals as compared with the prior art oscillator circuit arrangement for the production of the same frequencies. This will be most clearly illustrated by means of an example. As example is taken a known oscillator circuit arrangement for use in a communication system, comprising 280 channels within the frequency range 118–132 mc./s., i.e. having a frequency distance of 50 kc./s. In the prior art system, where the sum frequency produced in the mixing stage is utilized, one oscillator contains 14 crystals and the other oscillator contains 20 crystals, so that consequently each oscillator circuit arrangement contains in total 34 crystals. By using an oscillator circuit arrangement according to the invention it is possible to reduce the required number of crystals to, for example, 9, such as it will appear from the subsequent detailed description.

As a consequence of the circuit arrangement according to the invention using a greater multiplication factor than the prior art circuit arrangement, it was to be immediately expected that the circuit arrangement according to the invention would exhibit an inferior stability as regards the frequency variations originating from temperature changes. A closer consideration shows, however, that this is not the case provided that the crystals are cut along the same section and kept at the same temperature during operation, as under otherwise equal conditions there will then occur the same frequency variation. In an embodiment of the oscillator circuit arrangement according to the invention which is characterized in that the crystals are made along the same crystal section and so placed, that they have substantially the same temperature, the circuit arrangement containing one or more components having such temperature coefficient that the variation of the oscillator frequency originating from the temperature dependency of the crystals, is substantially eliminated, it is even possible in a simple manner to obtain a very effective stabilisation. The reason for the advantages attached to this embodiment is, that the major part of the temperature-dependent frequency variation, which occurs, is compensated for due to the use of the difference frequency, so that it is only such small frequency variations originated from the frequency difference between the two crystals, which is to be compensated for by means of the temperature variation of other components.

Moreover, the invention relates to a frequency modulated telephony transmitter comprising an oscillator circuit arrangement according to the invention having only one crystal in one of the oscillators, said transmitter being characterized in that between said oscillator and the mixing stage there is inserted a modulator. The advantage attached to this transmitter is, that modulation is only effected on one crystal, which can be adjusted to a definite frequency swing, which is common to all channels, so that a uniform modulation is obtained in the channels.

The invention is of importance not only in the cases, where it is wished to produce a plurality of separate frequencies or a continuously variable frequency, but may also sometimes be advantageous in single-channel equipments. In this case the advantage resides in, that for the manufacture of single-channel equipments for a great number of different frequencies, only a comparatively low number of different crystals are required, and the stock of spare crystals need only comprise a comparatively restricted number of different crystals. This will promote the delivery of single-channel equipments to a pre-determined frequency channel and will prevent such equipments from being put out of operation over a longer period because spare crystals are not immediately available.

Figure 3:
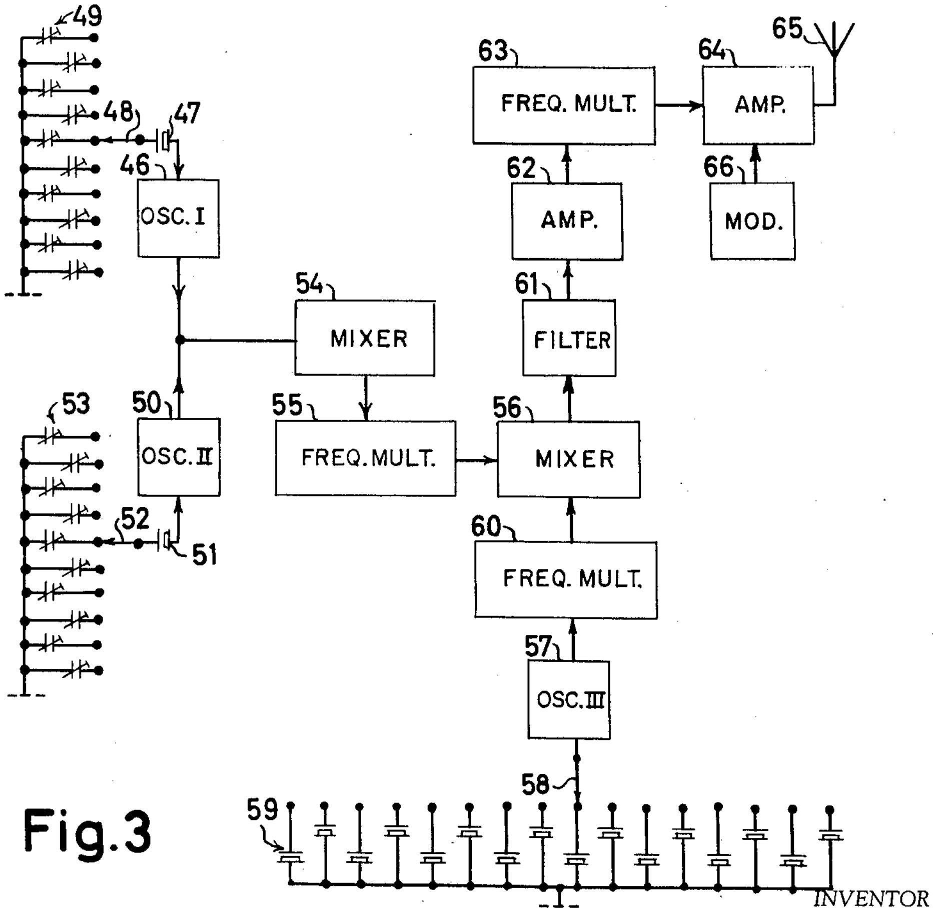
Figure 2:
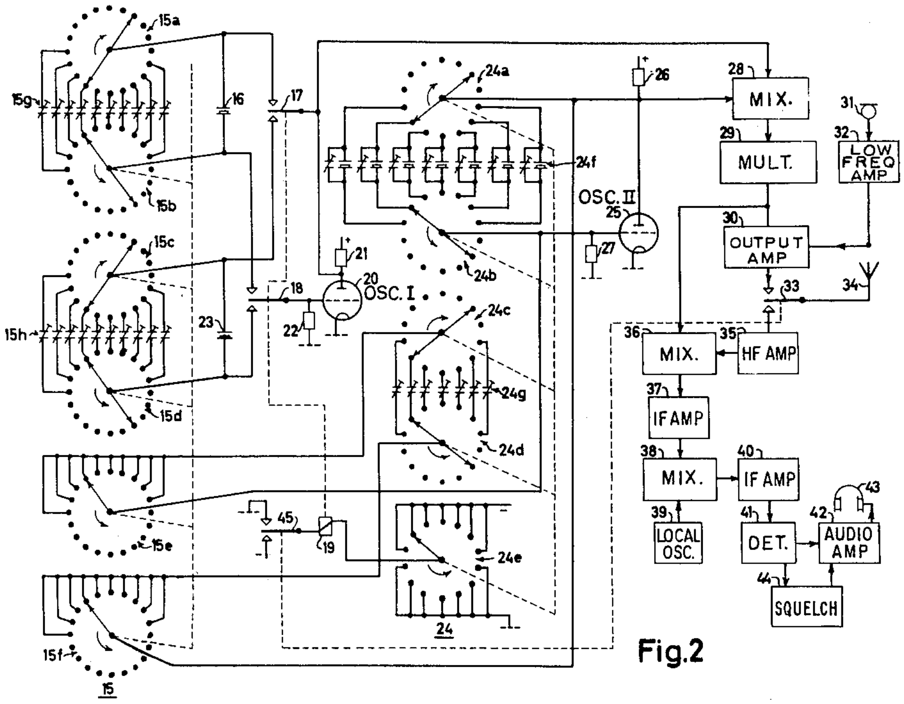
Figure 4:
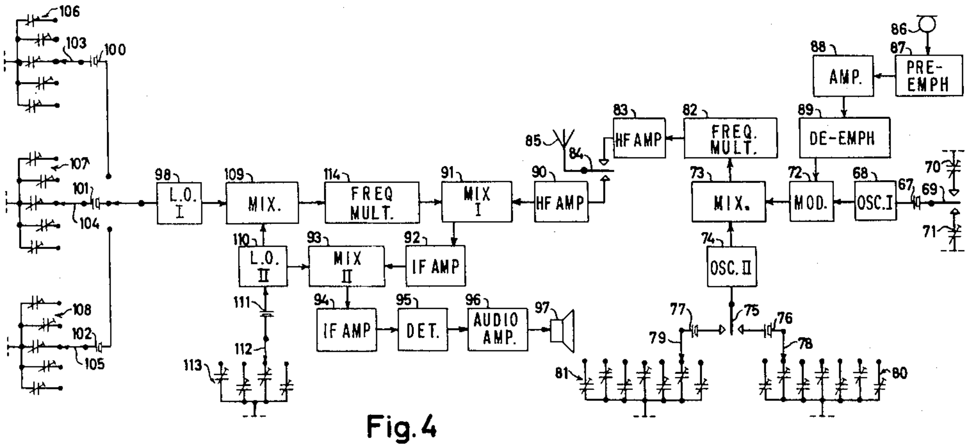
Figure 5:
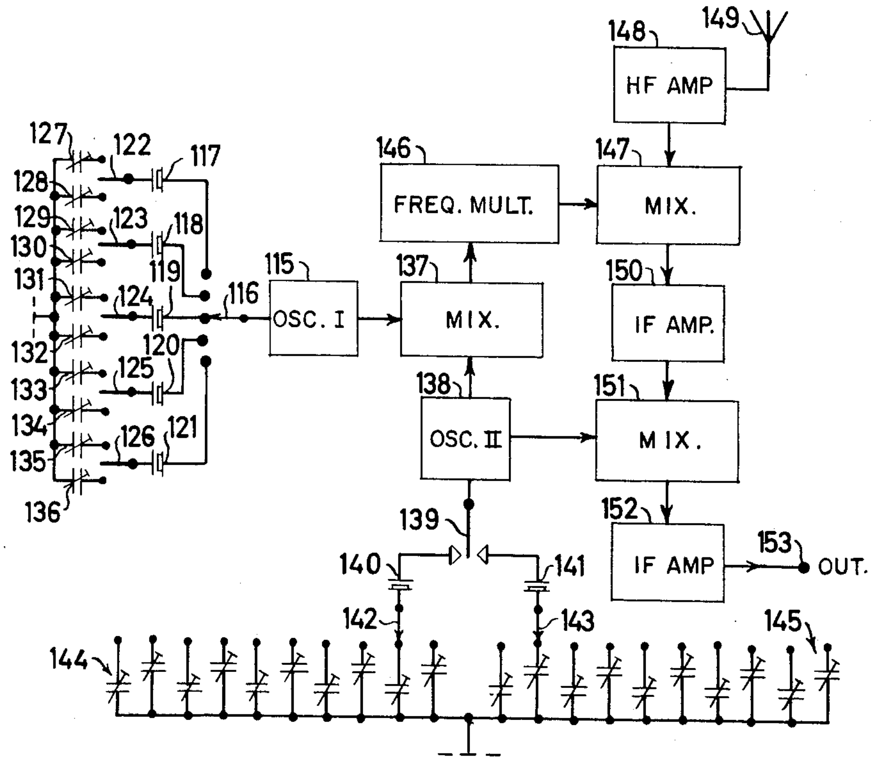

The invention will be explained in the following with reference to the drawing, where FIGURE 1 is a diagram of an oscillator circuit arrangement according to the invention and having a continuously variable frequency, FIGURE 2 is a diagram of a transceiver comprising an oscillator circuit arrangement according to the invention, which is adjustable to a number of fixed frequencies, FIGURE 3 is a diagram of a transmitter comprising an oscillator circuit arrangement according to the invention, FIGURE 4 is a diagram of the telephony transmitter according to the invention and a telephony receiver comprising an oscillator circuit arrangement according to the invention, and FIGURE 5 is a diagram of a part of a receiver comprising an oscillator circuit arrangement according to the invention.

The oscillator circuit arrangement illustrated in FIGURE 1 comprises a first oscillator 1, the frequency of which is controlled by a crystal 2, which is parallel-connected with a variable capacitor 3. The circuit arrangement also comprises a second oscillator 4, the frequency of which can be varied in steps by one of a plurality of crystals 6 to 11 being connected thereto by a switch 5. The oscillations generated by the two oscillators 1 and 4 are supplied to a mixing stage 12, which is so arranged that it selects the difference frequency between the two frequencies supplied, which difference frequency is supplied to a frequency multiplier 13, the output signal of which occurring on a terminal 14 is the output signal of the oscillator circuit arrangement.

If for example it be assumed, that by means of the capacitor 3 it is possible to vary the frequency of the oscillator 1 by about one per thousand of the nominal value of the frequency of the crystal 2, and if it be further assumed that the frequencies generated by the two oscillators 1 and 4 lie so close to each other that the difference between these two frequencies is about one tenth of the oscillator frequencies, it will be understood that in the difference signal occurring on the output of the mixing stage 12 it is possible by means of the capacitor 3 to obtain a relative frequency variation of about one percent, which fact is not changed by the subsequent multiplication in the frequency multiplier 13. If, for example it be assumed that the oscillator circuit arrangement is intended to cover a frequency range from 100 to 110 mc./s., and that the frequency multiplier 13 multiplies by a factor 100, it will seem, that the difference frequency on the output of the mixing stage 12 will have to vary from 1 mc./s. to 1.1 mc./s. If the frequency of the oscillator 1 is 10 mc./s., it can be varied continuously over a frequency range of 10 kc./s. If the frequency of the oscillator 4 can by means of the crystals 6 to 11 be adjusted to the values 11.00–11.01–11.02 . . . 11.09 mc./s., it will be seen that on the output of the mixing stage 12 the desired frequency occurs, which can be adjusted continuously from 1.0 to 1.1 mc./s., and which on the output terminal 14 gives the desired continuously variable frequency range from 100 to 110 mc./s. In the example as described there are of course required ten different crystals, which can be connected to the oscillator 4 instead of the six crystals 6 to 11 shown in the drawing.

The temperature stability of the frequency is as good as for an oscillator comprising only a single crystal provided that the crystals used in the oscillator circuit arrangement according to the invention are cut along the same crystal section, and that the simultaneously operating crystals have the same temperature. By using the difference frequency there is certainly obtained an apparent reduction of the influence of the temperature, because the temperature variation of the two oscillator frequencies go in the same direction, but since the oscillator frequencies are not quite identical, there will still remain a little temperature variation, and this variation will due to the required comparatively great multiplication factor for the multiplier 13 be multiplied so that the output signal of the oscillator circuit arrangement in practice exhibits the same temperature dependency as the signal from the prior art circuit arrangement comprising a single crystal or two crystals, the frequency of which is used. However, the circuit arrangement according to the invention has the advantage that in practice the remnant temperature dependency is almost entirely removable by simple means. This is due to the fact, that only a little variation is required in the frequency from one of the oscillators 1 and 4 to compensate for the little temperature-dependent variation of the difference frequency. The required compensating frequency variation can easily be obtained by suitable choice of the temperature coefficient of one or more of the components forming part of the oscillators, for example of a capacitor being series- or parallel-connected with the crystal.

The diagram of the transceiver shown in FIGURE 2 is partly a circuit diagram, partly a block diagram. The apparatus shown comprises a first switch 15 comprising six wafers, **15*a* to 15*f*. The switch has twenty positions, and each wafer has, therefore, twenty contacts, but only half of these contacts are connected. The switch arm of the wafers 15*a* to 15*d* are double arms, so that they always establish connection with one of the connected contacts, whereas the contact arms of wafers 15*e* and 15*f*** are single arms, so that only in half of the possible positions they are in connection with a connected contact.

Between each of the connected contacts of wafer **15*a* and the corresponding contact of the wafer 15*b* there is inserted a trimming capacitor 15*g*. The contact arms of wafers 15*a* and 15*b* are connected with the two ends of a crystal 16, which via change-over contacts 17 and 18 on a relay 19 can be connected between the anode and the grid of a triode 20, which has an anode resistance 21 and a grid leak 22. The triode 20 is connected as an oscillator, and will, when the change-over contacts 17 and 18 are in the upper positions, oscillate with a frequency which is determined by the crystal 16 and the trimming capacitor 15*g*** parallel-connected therewith at the relevant time.

Between each of the connected contacts of wafer **15*c* and the corresponding contact of wafer 15*d* there is inserted a trimming capacitor 15*h*. The contact arms of wafers 15*c* and 15*d* are connected with the two ends of a crystal 23, which likewise across the change-over contacts 17 and 18 can be connected between the anode and the grid of the triode 20. If the change-over contacts 17 and 18 are in their lower positions, the triode 20 will oscillate with a frequency which is determined by the crystal 23 and the trimming capacitor 15*h*** parallel-connected therewith at the relevant time.

The mode of operation of the relay 19 with the change-over contacts 17 and 18 will be explained in detail in the following.

The apparatus also comprises a second switch 24, comprising five wafers **24*a* to 24*c*. This switch has fourteen positions and consequently fourteen contacts in each wafer. In the wafers 24*a* to 24*d*, the associated contact arms of which are double arms, only seven contacts are connected. In wafer 24*e*, on the other hand, all contacts are connected. In return, the associated contact arm is only a single arm. Between each of the connected contacts of wafer 24*a* and the corresponding contact of wafer 24*b*, there is connected a parallel-connection 24*f* of a crystal and a trimming capacitor. These parallel-connections can via wafers 24*a* and 24*b* and the associated contact arm be connected between the anode and the grid of a triode 25 with associated anode resistance 26 and a grid leak 27. Between each of the connected contacts of wafer 24*c* and the corresponding contact of wafer 24*d*** there is connected a trimming capacitor **24*g*. The contact arm of wafer 24*d* is connected with the connected contacts, i.e. half of the contacts, of wafer 15*e* of the switch 15, and the contact arm of wafer 24*d* is connected with the connected contacts of wafer 15*f*. The contact arms of wafers 15*e* and 15*f* are connected with the grid and the anode, respectively, of the triode 25. This triode is connected as oscillator and will oscillate with a frequency which is determined by the parallel-connection 24*f* of a crystal and a trimming capacitor inserted at the relevant time by means of the switch 24, and possibly namely dependent on the position of the switch 15, by the trimming capacitor 24*e* inserted at the relevant time by means of the switch 24**.

The oscillations generated by the two triodes 20 and 25 are supplied to a mixing stage 28, wherein as output signal the difference frequency between the two oscillator frequencies is separated, which difference frequency is supplied to a frequency multiplier 29. The output signal of the frequency multiplier is supplied to a transmitter portion as well as to a receiver portion. The transmitter portion comprises an output amplifier 30, wherein the signal supplied from the frequency multiplier is modulated with a low frequency signal, which is supplied from the microphone 31 via a low frequency amplifier 32. The output signal from the output amplifier 30 can via a transmitting-receiving switch 33 be supplied to an aerial 34. By means of the switch 33, the aerial 34 can also be connected with a high frequency amplifier 35, the output signal of which is supplied to a mixing stage 36 to which also the output signal from the frequency multiplier 29 is supplied. The first intermediate frequency produced hereby is amplified in an intermediate frequency amplifier 37 and is supplied to a mixing stage 38, to which an oscillation from an oscillator 39 is also supplied, whereby on the output of the mixing stage a second intermediate frequency occurs, which is amplified in an intermediate frequency amplifier 40 and supplied to a detector 41. The output signal of the detector 41 is supplied via a low frequency amplifier 42 to a headphone 43 or, if so desired, to a loud-speaker. The output signal of the detector 41 is also supplied to a squelch-circuit controlling the low frequency amplifier 42.

The apparatus as described with reference to FIGURE 2 is especially intended for use in radiotelephony systems for civil aviation, even if the apparatus, if desired, after minor modifications, may of course also be used for other purposes.

However, the mode of operation will below be described in connection with the said communication system, where the communication is effected within the frequency range from 118 to 132 mc./s., which for this purpose is divided into 280 channels, the carrier waves of which consequently have a mutual frequency distance of 50 kc./s.

The switch 24 is in this case intended for adjustment of the desired mc./s., whereas the desired carrier frequency within the said mc./s. is adjusted by means of the switch 15.

The combinations **24*f* of a crystal and a trimming capacitor are so chosen and adjusted, that by shifting of the switch one step, a jump of one mc./s. in the output frequency of the frequency multiplier 29 is obtained, i.e. in the output frequency of the oscillator circuit arrangement. When the switch 24 is moved one full turn, the combinations 24*f* are traversed twice, but as a consequence of the presence of the switch wafer 24*e* there is after the passage of the first seven contacts effected a change of the state of actuation of the relay 19, whereby a shifting is effected between the crystals 16 and 23 in the oscillator comprising the triode 20. The mutual frequencies of the crystals 16 and 23 are now so chosen that the shifting between these crystals effects a jump in the output frequency of the oscillator circuit arrangement of 7 mc./s. By one full turn of the switch 24** the desired frequency range of 14 mc./s. is traversed in jumps of one mc./s each.

Within each full mc./s., the decimals are as mentioned above adjusted by means of the switch 15. To this end, it would theoretically be possible to do with twenty trimming capacitors in each set **15*g* and 15*h*, in which case the switch wafers 15*e*, 15*f*, 24*c* and 24*d* could be omitted. For the purpose of obtaining accuracy of adjustment and for the purpose of preventing the activity of the crystals from being unsafe, the entire available variation range for each of the crystals 16 and 23 is not used in the embodiment described, but only the half range. To this end, provision is made for the said switch wafers 15*e*, 15*f*, 24*c* and 24*d*, which have the effect that one of the trimming capacitors 24*g* is inserted in the frequency determining circuit of the triode 25 and thereby changes the output frequency of the oscillator circuit arrangement by 0.5 mc./s., when one of the sets 15*g* and 15*h*** is traversed once.

The trimming capacitors **15*g* and 15*h*** are so adjusted that by turning the switch one step, a jump of 50 kc./s. is effected in the output frequency of the oscillator circuit arrangement.

The transmitting-receiving switch 33 is mechanically connected with a change-over contact 45, which together with the switch wafer **24*e* is incorporated in the actuation circuit for the relay 19. The change-over contact 45 has the effect that when shifting between transmission and reception, shifting takes place between the crystals 16 and 23, whereby a jump is produced in the output frequency of the oscillator circuit arrangement by seven mc./s. This means that there is a difference of 7 mc./s. between the transmitting frequency supplied to the output amplifier 30 and the local oscillator frequency supplied to the mixing stage 36**, which again means that the first intermediate frequency of the receiver portion will be 7 mc./s.

Moreover, can by way of example be stated a frequency of about 8 mc./s. for the crystals 16 and 23, a frequency upwards of 9 mc./s. for the crystals in the combinations **24*f***, which gives a difference frequency upwards of 1 mc./s., which after the multiplication with a factor upwards of 100, for example 108, gives the desired output frequency of the oscillator circuit arrangement.

As mentioned above a known oscillator circuit arrangement intended for use in the transceiver described with reference to FIG. 2, and wherein it is the sum frequency of the two crystal oscillator frequencies which after multiplication gives the output signal of the oscillator circuit arrangement, contains 34 crystals whereas the oscillator circuit arrangement according to the invention only uses nine crystals in order to cover the same frequency range.

FIG. 3 illustrates a high frequency transmitter for the frequency range 2 to 14 mc./s. and having 1600 channels, the carrier waves of which have a mutual frequency distance of 7.5 kc./s.

The transmitter contains a first oscillator 46 and an appurtenant crystal 47 which via a switch 48 can be series-connected with one of ten trimming capacitors 49. Moreover, the transmitter contains a second oscillator 50 with an appurtenant crystal 51 which via a switch 52 can be series-connected with one of ten trimming capacitors 53. The output signals of the oscillators 46 and 50 are supplied to a mixing stage 54 which selects the difference frequency between the two frequencies supplied from the oscillators and supplies the said difference frequency to a frequency multiplier 55, the output signal of which is supplied to a second mixing stage 56. A third oscillator 57 can via a switch 58 be connected to one of 16 crystals 59. The output signal of the oscillator 57 is supplied via a frequency multiplier 60 to the mixing stage 56, the output signal of which is via a filter 61, which again selects the difference frequency between the frequencies supplied to the mixing stage 56, and via an amplifier 62 supplied to a further frequency multiplier 63, the output signal of which is via an amplifier 64 supplied to a transmitting aerial 65. By means of a modulator 66 connected to the amplifier 64 the transmitted carrier wave is modulated.

The frequencies of the crystals 47 and 51 may for example be about 15 and about 14 mc./s., respectively, so that at the output of the mixing stage 54 a frequency of about 1 mc./s. occurs, which in the frequency multiplier 55 is for example multiplied by a factor 64. The frequencies of the crystals 59 may lie at about 30 mc./s., which after multiplication in the multiplier 60 by a factor 2 gives a frequency of about 60 mc./s. Hereafter, the output signal of the filter 61 will have a frequency of about 4 mc./s., which after multiplication by a factor 2 in the multiplier 63 gives a frequency lying within the desired range. As with the crystals 47 and 51 and the associated trimming capacitors 100 channels are covered, the distance between the frequencies of the crystals 59 must correspond to a frequency jump of 750 kc./s. in the transmitter frequency.

It will be seen that in the described transmitter there is by means of only 18 crystals obtained a possibility of adjustment to 1600 separate channels.

FIG. 4 illustrates a combined transmitter and receiver, which for example is suitable for use in ships communication systems, working at frequencies of about 160 mc./s.

The transmitter may for example be arranged for 28 channels, the carrier waves of which have a mutual frequency distance of 50 kc./s., and the receiver may be adapted to receive in 30 channels of which some are coincident with the said transmitter channels, whereas others are situated outside the frequency band occupied by the transmitter channels.

The transmitter contains a first crystal 67 controlling a first oscillator 68, and which via a switch 69 may be connected with one of two trimming capacitors 70 and 71, so that according to wish the oscillator 68 may be tuned to one of two frequencies. The output signal of the oscillator 68 is via a modulator 72 supplied to a mixing stage 53 to which also the output signal of a second oscillator 74 is supplied, which via a switch 75 according to wish may be controlled by one of two crystals 76 and 77. Each of the crystals 76 and 77 may via a switch 78 and 79, respectively, be series-connected with one of seven capacitors, 80 and 81, respectively. By means of the said switches 69, 75, 78 and 79, the output signal of the mixing stage 73 may be adjusted to 28 different frequencies. The output signal of the frequency changer 73 is via a frequency multiplier 82, a high frequency amplifier 83 and a transmitting-receiving switch 84 supplied to an aerial 85. The modulator 72 is controlled by a low frequency signal, which is from a microphone 86 via a pre-emphasizing network 87, an amplifier 88 and a deemphasizing network 89 supplied to the modulator.

It will be seen that in the transmitter as described modulation is effected only on the signal from a single crystal, namely the crystal 67, for which reason it is possible to adjust a definite frequency swing, which is common to all channels. Hereby is obtained a uniform modulation in all channels.

The signal received via the aerial 85, is via the transmitting-receiving switch 84 supplied to a high frequency amplifier and thereupon to a first mixing stage 91, wherein a first intermediate frequency is generated, which after amplification in an intermediate frequency amplifier 92 is supplied to a second mixing stage 93. On the output of this mixing stage the second intermediate frequency occurs which via a second intermediate frequency amplifier 94 is supplied to a detector 95, the output signal of which is via a low frequency amplifier 96 supplied to a loud-speaker 97.

The local oscillations to be supplied to the two mixing stages 91 and 93 are generated by means of an oscillator circuit arrangement comprising a first oscillator 98, which can according to wish via a switch 99 be controlled by one of three crystals 100, 101 and 102, each of which may according to wish via a switch 103, 104 and 105, respectively, be connected with one of five trimming capacitors 106, 107 and 108, respectively. The output signal of the oscillator 98 is supplied to a mixing stage 109, to which also the signal from an oscillator 110 is supplied, which oscillator is controlled by means of a crystal 111, which can according to wish via a switch 112 be connected with one of four trimming capacitors 113. The output signal of the mixing stage 109 which separates the difference frequency between the two frequencies supplied from the oscillators 98 and 110 is via a frequency multiplier 114 supplied to the mixing stage 91. The local oscillation to the mixing stage 93 is obtained directly from the oscillator 110.

As will be seen from FIG. 4 it is by means of the switches 99, 103, 104, 105 and 112 theoretically possible to produce 60 different frequencies. When it has been necessary to use such arrangement in spite of the fact that the receiver, as mentioned, is only intended for being adjusted to 30 different channels, the reason is to be sought in the fact that these channels are not positioned immediately next to each other, but are distributed over two frequency bands having a mutual frequency distance of about 4 mc./s.

Eventually, FIG. 5 illustrates a VHF-receiver which for example may be used as a naviagation receiver within the frequency range from 108–118 mc./s., and which covers 200 channels having a mutual carrier frequency distance of 50 kc./s.

The receiver comprises a first oscillator 115 which via a switch 116 may according to wish be controlled by one of five crystals 117 to 121 each of which may via a switch, 122 and 126, respectively, be series-connected with one or the other of two trimming capacitors 127 to 136, respectively. The output signal of the oscillator 115 is supplied to a mixing stage 137 to which also the output signal of an oscillator 138 is supplied, which oscillator may according to wish via a switch 139 be controlled by one or the other of two crystals 140 and 141, each of which may via a switch 142 and 143, respectively, be series-connected with one of ten trimming capacitors 144 and 145, respectively. The mixing stage 137 is adapted to separate as its output signal the difference frequency between the two frequencies supplied from the oscillators 115 and 138, said output signal being via a frequency multiplier 146 supplied to a first mixing stage 147 to which also the signal received by means of an aerial 149 is supplied via a high frequency amplifier 148. The first intermediate frequency generated in the mixing stage 147 is amplified in an intermediate frequency amplifier 158 and is then supplied to a second mixing stage 151 to which also the output signal of the oscillator 138 is supplied for generating the second intermediate frequency, which after amplification in a second intermedaite frequency amplifier 152 is supplied to an output terminal 153 from where the signal can be supplied to some equipment for utilisation.

In connection with the embodiments described above there are mentioned different examples of application and possible frequency ranges. It is evident that the constructions described by a simple modification of a number of switches, crystals and trimming capacitors, and by modifying the resonant frequencies of the crystals can also be adapted for use within other fields and with other frequency bands.

What I claim is:

1. An oscillator circuit for providing a temperature stabilized and variable frequency output comprising, a first oscillator having a natural frequency $f_1$ and a number of crystal means connected to control said frequency of said first oscillator, a second oscillator having a natural frequency $f_2$ and a number of crystal means connected to control said frequency of said second oscillator and wherein $f_1 \doteq f_2$, said crystals of said first and second oscillators being of the same crystal cut, variable reactance means coupled to a number of said crystals of said first and said second oscillators to control the oscillating frequencing of said crystals, a mixing stage having first and second inputs coupling said first and second frequencies of said first and second oscillators respectively, and an output for providing the difference frequency of said first and second frequencies, a frequency multiplier having an input connected to said output of said mixing stage, the natural frequencies of said crystals of said first and said second oscillators being at least ten times greater than said difference frequency, and first and second temperature compensating means coupled to and forming part of said first and second oscillators for providing said temperature stabilized output.

2. An FM receiver and oscillator circuit for providing a temperature stabilized and variable frequency output comprising, a first oscillator having a natural frequency $f_1$ and a number of crystal means connected to control said frequency of said first oscillator, a second oscillator having a natural frequency $f_2$ and a number of crystal means connected to control said frequency of said second oscillator and wherein $f_1 \doteq f_2$, said crystals of said first and second oscillators being of the same crystal cut, variable reactance means coupled to a number of said crystals of said first and said second oscillators to control the oscillating frequencing of said crystals, a modulation stage having an input coupled to said first oscillator, a mixing stage having a first input coupled to said modulating stage and a second input coupled to said second oscillator, and an output for providing the difference frequency of said first and second frequencies occurring at said first and second inputs, a frequency multiplier having an input connected to said output of said mixing stage, the natural frequencies of said crystals of said first and said second oscillators being at least ten times greater than said difference frequency, and first and second temperature compensating means coupled to and forming part of said first and second oscillators for providing said temperature stabilized output.

3. An FM receiver and oscillator circuit for providing a temperature stabilized and variable frequency output comprising, a first oscillator having a natural frequency $f_1$ and a number of crystal means connected to control said frequency of said first oscillator, a second oscillator having a natural frequency $f_2$ and a number of crystal means connected to control said frequency of said second oscillator and wherein $f_1 \doteq f_2$, said crystals of said first and second oscillators being of the same crystal cut, variable reactance means coupled to a number of said crystals of said first and said second oscillators to control the oscillating frequencing of said crystals, a first mixing stage having first and second inputs coupling said first and second frequencies of said first and second oscillators, respectively, and an output for providing the difference frequency of said first and second frequencies, a frequency multiplier having an input connected to said output of said mixing stage, the natural frequencies of said crystals of said first and said second oscillators being at least ten times greater than said difference frequency, a second mixing stage for producing a first intermediate frequency and having first and second inputs coupled to said frequency multiplier and an antenna means respectively, a third mixing stage for providing a second intermediate frequency having first and second inputs coupled to said second oscillator and said second mixing stage, and first and second temperature compensating means coupled to and forming part of said first and second oscillators, respectively, for providing said temperature stabilized output.

References Cited by the Examiner

UNITED STATES PATENTS

| | | | |
|---|---|---|---|
| 1,717,451 | 6/1929 | Hund | 331—40 X |
| 1,841,489 | 1/1932 | Marrison | 331—41 |
| 2,157,576 | 5/1939 | Schneider | 331—69 |
| 2,456,811 | 12/1948 | Blackburn | 331—40 X |
| 2,523,106 | 9/1950 | Fairbairn et al. | 331—40 |
| 2,562,575 | 7/1951 | Raesler | 331—40 X |
| 2,756,331 | 7/1956 | Foster et al. | 331—40 |
| 2,816,229 | 12/1957 | Vantine | 331—40 |
| 2,859,346 | 11/1958 | Firestone et al. | 331—37 |
| 3,085,202 | 4/1963 | Jakubowics | 325—25 |

FOREIGN PATENTS

| | | |
|---|---|---|
| 862,174 | 1/1953 | Germany. |
| 477,912 | 1/1938 | Great Britain. |

DAVID G. REDINBAUGH, *Primary Examiner.*

J. W. CALDWELL, *Assistant Examiner.*